(12) United States Patent
Huang et al.

(10) Patent No.: US 10,355,088 B2
(45) Date of Patent: Jul. 16, 2019

(54) METAL OXIDE SEMICONDUCTOR DEVICE HAVING MITIGATED THRESHOLD VOLTAGE ROLL-OFF AND THRESHOLD VOLTAGE ROLL-OFF MITIGATION METHOD THEREOF

(71) Applicant: RICHTEK TECHNOLOGY CORPORATION, Chupei, HsinChu (TW)

(72) Inventors: Tsung-Yi Huang, Hsinchu (TW); Ying-Shiou Lin, Chiayi (TW)

(73) Assignee: RICHTEK TECHNOLOGY CORPORATION, Chupei, Hsinchu (TW)

( * ) Notice: Subject to any disclaimer, the term of this patent is extended or adjusted under 35 U.S.C. 154(b) by 0 days.

(21) Appl. No.: 15/622,227

(22) Filed: Jun. 14, 2017

(65) Prior Publication Data
US 2018/0190773 A1 Jul. 5, 2018

(30) Foreign Application Priority Data
Jan. 5, 2017 (TW) .............................. 106100292 A (51) Int. Cl.
*H01L 29/78* (2006.01)
*H01L 29/06* (2006.01)
(Continued)

(52) U.S. Cl.
CPC .......... *H01L 29/1083* (2013.01); *H01L 21/74* (2013.01); *H01L 29/0653* (2013.01);
(Continued)

(58) Field of Classification Search
CPC ............... H01L 29/038; H01L 29/0642; H01L 29/1083; H01L 29/6659; H01L 21/74;
(Continued)

(56) References Cited

U.S. PATENT DOCUMENTS 5,059,550 A   10/1991   Tateoka et al.
5,275,965 A   1/1994    Manning
(Continued)

FOREIGN PATENT DOCUMENTS

EP      95303698.5      5/1995

*Primary Examiner* — Matthew L Reames
*Assistant Examiner* — Benjamin Tzu-Hung Liu
(74) *Attorney, Agent, or Firm* — Tung & Associates (57) ABSTRACT

The present invention provides a MOS (Metal-Oxide-Silicon) device having mitigated threshold voltage roll-off and a threshold voltage roll-off mitigation method therefor. The MOS device includes: a substrate, a well region, an isolation region, a gate, two LDDs (Lightly-Doped-Drains), a source, a drain and a compensation doped region. The compensation doped region is substantially in contact with at least a part of a recessed portion along the channel length direction. Viewing from a cross-section view, at a boundary where the compensation doped region is in contact with the isolation region along the channel length direction, the compensation doped region has two doped region widths along the channel width direction, wherein, the two doped region widths of the compensation doped region are both not greater than 10% of the width of the operation region. Two doped region widths are defined as distances within an interior part and an exterior part of the operation region, respectively.

8 Claims, 5 Drawing Sheets

(51) Int. Cl.
  *H01L 29/10*  (2006.01)
  *H01L 21/74*  (2006.01)
  *H01L 29/08*  (2006.01)
  *H01L 29/66*  (2006.01)

(52) U.S. Cl.
  CPC ...... *H01L 29/7833* (2013.01); *H01L 29/0847* (2013.01); *H01L 29/6659* (2013.01)

(58) Field of Classification Search
  CPC ............. H01L 29/0847; H01L 29/0653; H01L 29/7833
  See application file for complete search history.

(56) References Cited

U.S. PATENT DOCUMENTS

| | | |
|---|---|---|
| 5,994,202 A | 11/1999 | Gambino et al. |
| 6,084,276 A | 7/2000 | Gambino et al. |
| 6,291,300 B1 * | 9/2001 | Fukazawa ......... H01L 21/76224 257/E21.546 |
| 9,093,517 B2 * | 7/2015 | Schmid ................... H01L 29/78 |
| 2010/0059815 A1 | 3/2010 | Grivna et al. |
| 2015/0171809 A1 * | 6/2015 | Song ............... H01L 21/823437 330/257 |

\* cited by examiner

METAL OXIDE SEMICONDUCTOR DEVICE HAVING MITIGATED THRESHOLD VOLTAGE ROLL-OFF AND THRESHOLD VOLTAGE ROLL-OFF MITIGATION METHOD THEREOF

CROSS REFERENCE

The present invention claims priority to TW 106100292, filed on Jan. 5, 2017.

BACKGROUND OF THE INVENTION

Field of Invention

The present invention relates to a metal oxide semiconductor (MOS) device wherein the threshold voltage roll-off problem is mitigated and a threshold voltage roll-off mitigation method thereof; particularly, it relates to such MOS device and threshold voltage roll-off mitigation method capable of mitigating the threshold voltage roll-off problem of the MOS device through the formation of a compensation doped region which is substantially in contact with a recessed isolation region along the channel length direction.

Description of Related Art

When a conventional MOS device has a small size, particularly when a channel width of this conventional MOS device is small, a recessed isolation region will be formed at a boundary between an isolation region and an operation region of this conventional MOS device in the channel width direction. This recessed isolation region, as compared to other parts of the operation region, will have a relatively higher electric field during conduction operation. As a consequence, undesirably, this recessed isolation region will form an inversion layer to turn on the MOS device before the other parts of the operation region form an inversion layer. Thus, an undesirable threshold voltage roll-off occurs, that is, at least a part of the MOS device is turned ON by a voltage lower than the designed threshold voltage, and therefore the characteristics and performance of the MOS device are unstable.

In view of the above, to overcome the drawback in the prior art, the present invention proposes a MOS device wherein the threshold voltage roll-off problem is mitigated, and a threshold voltage roll-off mitigation method thereof. Through the formation of a compensation doped region which is substantially in contact with a recessed isolation region along the channel length direction, the present invention is capable of mitigating the threshold voltage roll-off problem of the MOS device.

SUMMARY OF THE INVENTION

From one perspective, the present invention provides a metal oxide semiconductor (MOS) device, comprising: a substrate having an upper surface, the substrate including an isolation region formed on the upper surface for defining an operation region; wherein, viewing from a first cross-section view taken along a channel width direction, the isolation region has a recessed portion located at a boundary between the isolation region and the operation region; and wherein, the operation region has a width in the channel width direction; a well region with a first conductive type, which is formed beneath the upper surface in the substrate; a gate, which is formed on the upper surface and which is stacked on and in contact with the upper surface in a vertical direction, wherein, viewing from a second cross-section view taken along a channel length direction which is perpendicular to the channel width direction, the gate is within the operation region; a source and a drain, each of which has a second conductive type, wherein, viewing from the second cross-section view, the source and the drain are at different sides of the gate, respectively; two lightly doped diffusions (LDDs) having a same conductive type as the source and the drain, wherein, viewing from the second cross-section view, the two LDDs are at different sides of the gate, respectively; and a compensation doped region with a first conductive type, which is formed beneath the upper surface in the substrate, wherein the compensation doped region is substantially in contact with at least a part of the recessed portion along the channel length direction; wherein, the compensation doped region has a total width in the channel width direction, the total width including a first doped region width in the channel width direction, which is defined as a distance inside the operation region as the total width is projected to the upper surface, and a second doped region width in the channel width direction, which is defined as a distance outside the operation region as the total width is projected to the upper surface, wherein the total width is a sum of the two doped region widths of the compensation doped region and the two doped region widths of the compensation doped region are both not greater than 10% of the width of the operation region; wherein, the compensation doped region has a depth, and the well region has a depth, and the depth of the compensation doped region is not deeper than the depth of the well region along the channel length direction, wherein depth is defined as a distance extending from the upper surface downward in a vertical direction which is perpendicular to both the channel width direction and the channel length direction.

From another perspective, the present invention provides a manufacturing method of a threshold voltage roll-off mitigation method for a MOS device, comprising: providing a substrate having an upper surface, the substrate including an isolation region formed on the upper surface for defining an operation region; wherein, viewing from a first cross-section view taken along a channel width direction, the isolation region has a recessed portion located at a boundary between the isolation region and the operation region; and wherein, the operation region has a width in the channel width direction; forming a well region with a first conductive type, beneath the upper surface in the substrate; forming a gate on the upper surface, which is stacked on and in contact with the upper surface in a vertical direction, wherein, viewing from a second cross-section view taken along a channel length direction which is perpendicular to the channel width direction, the gate is within the operation region; forming a source and a drain, each of which has a second conductive type, wherein, viewing from the second cross-section view, the source and the drain are at different sides of the gate, respectively; forming two lightly doped diffusions (LDDs) having a same conductive type as the source and the drain, wherein, viewing from the second cross-section view, the two LDDs are at different sides of the gate, respectively; and forming a compensation doped region with a first conductive type, beneath the upper surface in the substrate, wherein the compensation doped region is substantially in contact with at least a part of the recessed portion along the channel length direction; wherein, the compensation doped region has a total width in the channel width direction, the total width including a first doped region width in the channel width direction, which is defined as a distance inside the operation region as the total width is projected to the upper surface, and a second doped region width in the channel width direction, which is defined as a distance outside the operation region as the total width is projected to the upper surface, wherein the total width is a sum of the two doped region widths of the compensation doped region and the two doped region widths of the compensation doped region are both not greater than 10% of the width of the operation region; wherein, the compensation doped region has a depth, and the well region has a depth, and the depth of the compensation doped region is not deeper than the depth of the well region along the channel length direction, wherein depth is defined as a distance extending from the upper surface downward in a vertical direction which is perpendicular to both the channel width direction and the channel length direction.

In one embodiment, a concentration of the first conductive type impurities of the compensation doped region is higher than a concentration of the first conductive type impurities of the well region.

In one embodiment, the isolation region includes a shallow trench isolation (STI) structure.

In one embodiment, viewing from a top view, the compensation doped region entirely covers a junction between the operation region and the isolation region along the channel length direction.

The objectives, technical details, features, and effects of the present invention will be better understood with regard to the detailed description of the embodiments below, with reference to the attached drawings.

DESCRIPTION OF THE PREFERRED EMBODIMENTS

The above and other technical details, features and effects of the present invention will be will be better understood with regard to the detailed description of the embodiments below, with reference to the drawings. The drawings as referred to throughout the description of the present invention are for illustration only, to show the interrelations between the regions and the process steps, but not drawn according to actual scale.

Figure 1A:
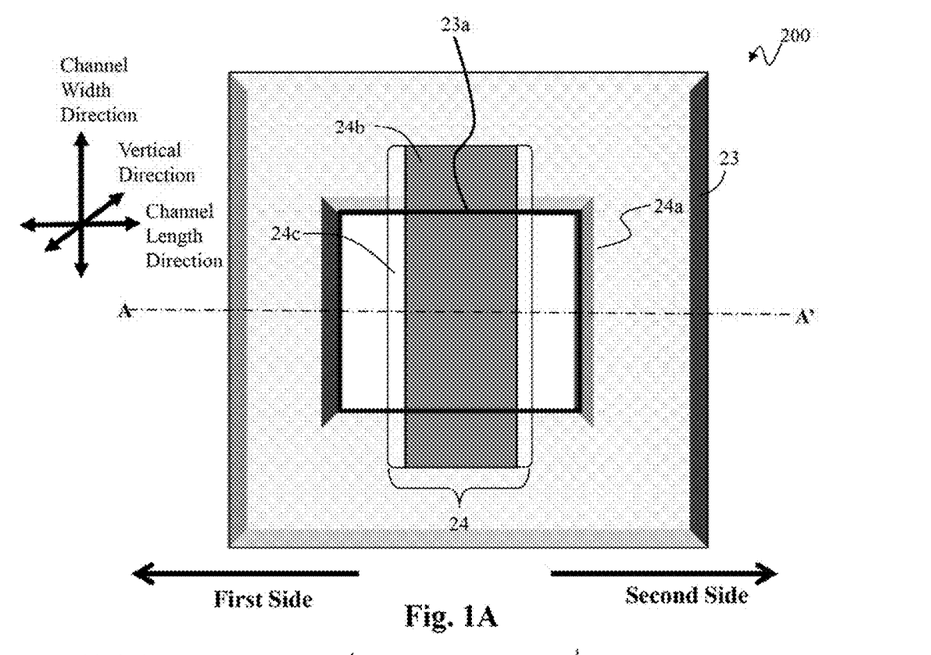
FIGS. 1A and 1B are schematic diagrams showing a top view and a cross-section view (taken from a cross-section line AA' in parallel with a channel length direction) of an embodiment according to the present invention, respectively.
Figure 1B:
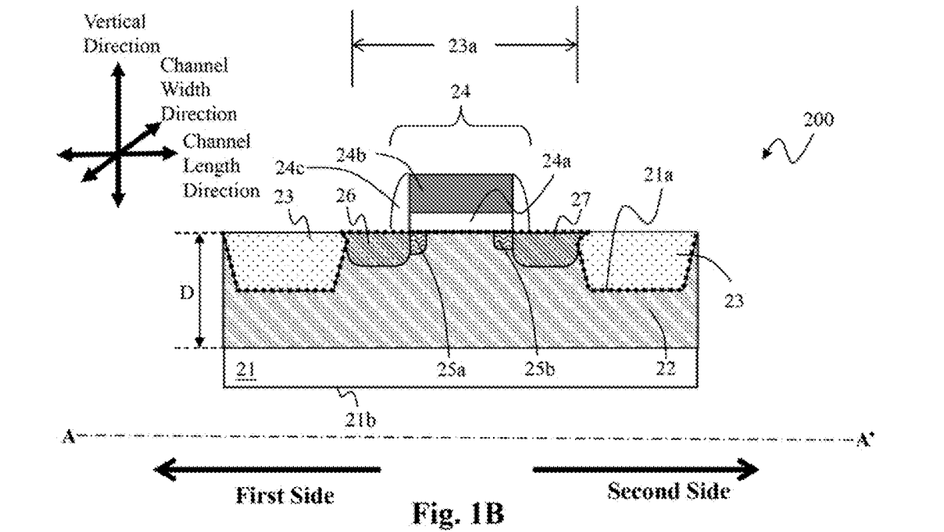
Figure 2:
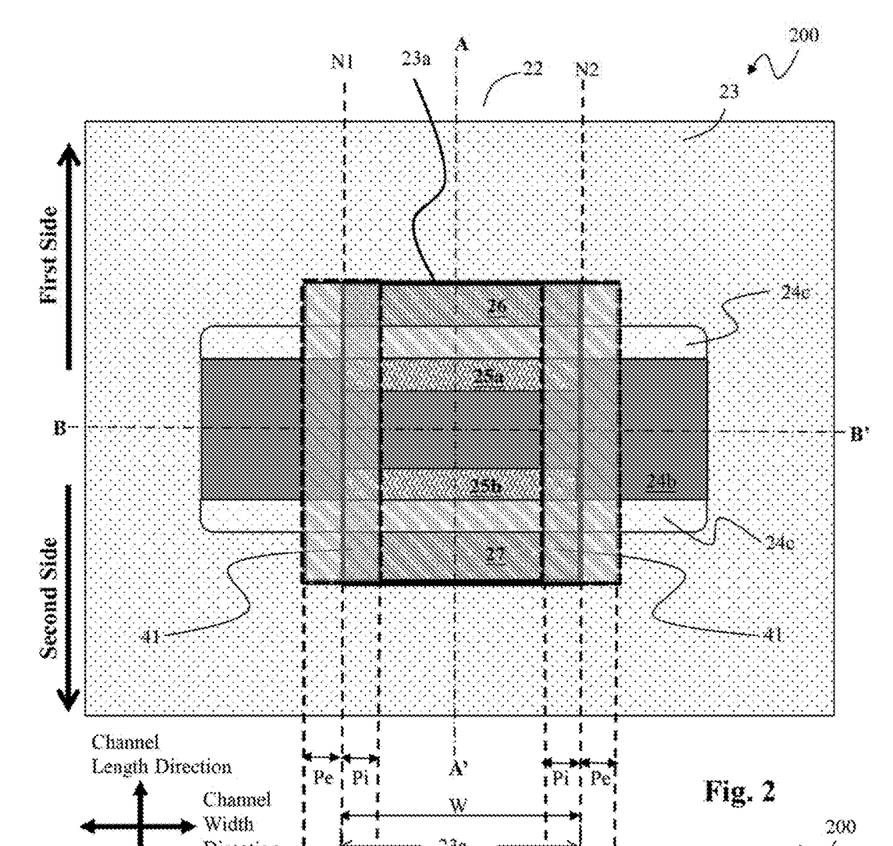
FIG. 2 shows a top view of an embodiment according to the present invention.
Figure 3:
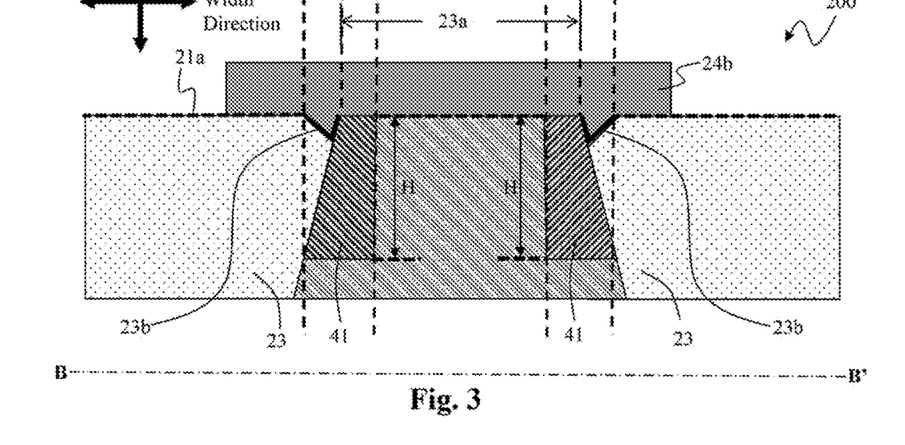
FIG. 3 is a schematic diagram showing a cross-section view (taken from a cross-section line BB' in parallel with a channel width direction) of an embodiment according to the present invention.

Please refer to FIGS. 1A and 1B in conjugation with FIGS. 2 and 3. FIGS. 1A and 1B are schematic diagrams showing a top view and a cross-section view (taken from a cross-section line AA' in parallel with a channel length direction) of an embodiment according to the present invention, respectively. FIG. 2 shows a top view of the present invention. FIG. 3 is a schematic diagram showing a cross-section view (taken from a cross-section line BB' in parallel with a channel width direction) of an embodiment according to the present invention.

Note that, in order to clearly illustrate the operation region 23a, FIG. 1A only illustrates the isolation region 23 and the gate 24, while other parts of the MOS device are omitted, so that the operation region 23a defined by the isolation region 23 can be clearly shown.

As shown in FIGS. 1A and 1B, a metal oxide semiconductor (MOS) device 200 of the present invention is formed in a substrate 21 with an upper surface 21a (as indicated by a dotted line shown in FIG. 1B) and a lower surface 21b, wherein "upper" and "lower" are referring to a vertical direction perpendicular to the lower surface 21b. The MOS device 200 includes a well region 22, an isolation region 23, a gate 24, two lightly doped diffusions (LDDs) 25a and 25b, a source 26 and a drain 27. The gate 24 includes a dielectric layer 24a, a stack layer 24b, and a spacer layer 24c. The substrate 21 is for example but not limited to a P-type silicon substrate; however, the substrate 21 may instead be a different kind of semiconductor substrate other than a silicon substrate. The well region 22 is formed beneath the upper surface 21a. The isolation region 23 is formed on the upper surface 21a for defining an operation region 23a of the MOS device 200. The operation region 23a is defined as a region where an operation of the MOS device 200 takes place, which is indicated by a thick frame as shown in FIG. 1A and is indicated in FIG. 1B.

In one embodiment, the isolation region 23 can be, for example but not limited to, a shallow trench isolation (STI) structure as shown in FIGS. 1A and 1B.

The conductive type of the well region 22 is for example but not limited to P-type. The LDDs 25a and 25b, the source 26, and the drain 27 are formed beneath the upper surface 21a, and the conductive type of the LDDs 25a and 25b, the source 26, and the drain 27 is for example but not limited to N-type. The gate 24 is stacked on and in contact with the upper surface 21a and is located between the source 26 and the drain 27.

Viewing from the cross-section view of FIG. 1B, the gate 24 is within the operation region 23a. The stack layer 24b divides the operation region 23a to a first side and a second side, as indicated by thick arrows in FIGS. 1A and 1B. The stack layer 24b includes a conductive material; the stack layer 24b is formed on the dielectric layer 24a as an electrical contact of the gate 24. In one embodiment, the stack layer 24b may be used as a self-aligned mask for forming the LDDs 25a and 25b. The spacer layer 24c includes an insulating material, and it is formed on the upper surface 21a outside the side walls of the stack layer 24b, overlaying the side walls of the stack layer 24b. In one embodiment, the spacer layer 24c may be used as a self-aligned mask for forming the source 26 and the drain 27. Note that: although the LDDs 25a and 25b and the source 26 and the drain 27 are formed by implantations using the stack layer 24b and the spacer layer 24c as self-aligned masks, due to later thermal diffusion, the final distributions of the impurities extend beyond the original implanted areas, as shown in FIGS. 1B and 2.

The source 26 and the drain 27 are located at the first side and the second side of the gate 24, respectively. The source 26 is formed at the first side beneath the upper surface 21a of the substrate 21, and at least a part of the source 26, viewing from the top view of FIG. 2, overlaps (is located under) the spacer layer 24c near the first side. The drain 27 is formed at the second side beneath the upper surface 21a of the substrate 21, and at least apart of the drain 27, viewing from the top view of FIG. 2, overlaps (is located under) the spacer layer 24c near the second side.

The LDD 25a and the LDD 25b are at different sides of the gate 24, respectively. The LDD 25a is formed at the first side beneath the upper surface 21a of the substrate 21, and at least a part of the LDD 25a, viewing from the top view of FIG. 2, overlaps (is located under) the stack layer 24b. For example, in this embodiment, the LDD 25a entirely overlaps (is entirely located under) the stack layer 24b. The LDD 25b is formed at the second side beneath the upper surface 21a of the substrate 21, and at least a part of the LDD 25b, viewing from the top view of FIG. 2, overlaps (is located under) the stack layer 24b. For example, in this embodiment, the LDD 25b entirely overlaps (is entirely located under) the stack layer 24b.

Next, please refer to FIG. 3 in conjugation with FIG. 2. FIG. 3 is a schematic diagram showing a cross-section view taken from a cross-section line BB' in parallel with a channel width direction, wherein the channel length direction is perpendicular to the channel width direction, i.e., the cross-section line BB' is perpendicular to the cross-section line AA'.

Viewing from the cross-section view of FIG. 3, the isolation region 23 has a recessed portion (recessed isolation region) 23b. This recessed isolation region 23b is located at a boundary between isolation region 23 and the operation region 23a (referring to the dashed line N1 and the dashed line N2 in FIG. 2). As seen from FIGS. 2 and 3, the operation region 23a has a width W in the channel width direction.

The present invention is different from the prior art in that: as shown in FIG. 3, a compensation doped region 41 is formed in the substrate 21, so that an electrical field around the recessed isolation region 23b is reduced. Consequently, an inversion layer is less likely formed at the recessed isolation region 23b the MOS device 200 when a gate voltage below the designed threshold voltage is applied on to the MOS device 200, thereby mitigating the threshold voltage roll-off problem of the MOS device 200. The compensation doped region 41 is formed beneath the upper surface 21a in the substrate 21. The conductive type of the compensation doped region 41 is for example but not limited to P-type. Preferably, in one embodiment, a concentration of the impurities (for example but not limited to P-type) of the compensation doped region 41 is higher than a concentration of the impurities (for example but not limited to P-type) of the well region 22.

Figure 5:
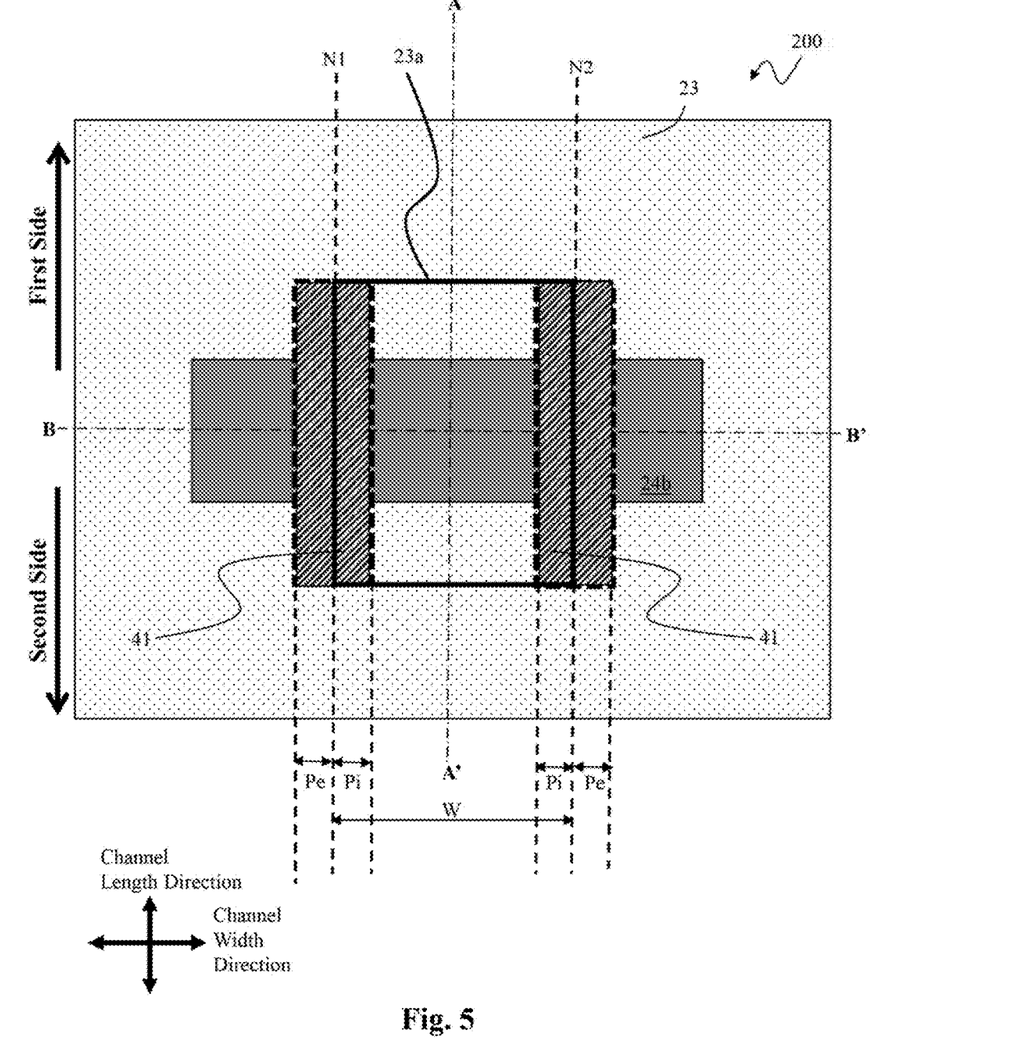
FIG. 5 shows a top view of an embodiment according to the present invention.

Please refer to FIG. 5 in conjugation with FIG. 3. FIG. 5 shows a top view of an embodiment according to the present invention. For simplicity of illustration, certain elements shown in FIG. 2 are omitted in FIG. 5; in FIG. 5, only the isolation region 23, the operation region 23a, the compensation doped region 41, and the stack layer 24b are shown. In one embodiment, viewing from the top view of FIG. 5 with reference to the cross-section view of FIG. 3, the compensation doped region 41 is substantially in contact with at least a part of the recessed isolation region 23b along the channel length direction (referring also to the top view of FIG. 2). In another embodiment, the compensation doped region 41 can entirely cover a junction between the operation region 23a and the isolation region 23 along the channel length direction.

Figure 4:
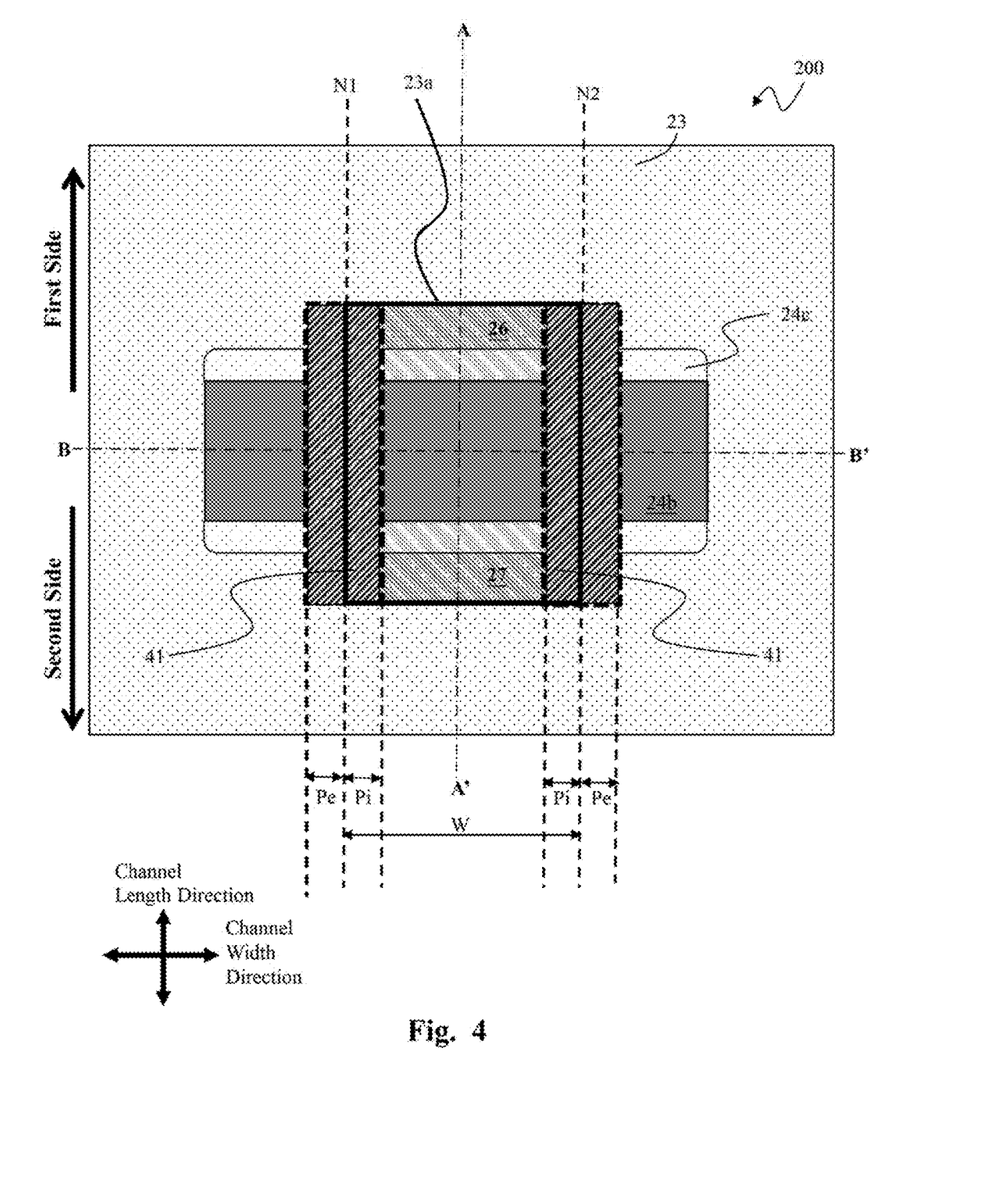
FIG. 4 shows a top view of an embodiment according to the present invention.

Please refer to FIG. 4 in conjugation with FIG. 3. FIG. 4 shows a top view of an embodiment according to the present invention. For simplicity of illustration, certain elements shown in FIG. 2 are omitted in FIG. 4; in FIG. 4, only the isolation region 23, the operation region 23a, the compensation doped region 41, the source 26, the drain 27, the stack layer 24b and the spacer layer 24c are shown. Viewing from the cross-section view of FIG. 3 with reference to the top view of FIG. 4, each compensation doped region 41 has a total width in the channel width direction; as the total width is projected to the upper surface, the total width includes a first doped region width Pi in the channel width direction, which is defined as a distance inside the operation region 23, and a second doped region width Pe in the channel width direction, which is defined as a distance outside the operation region 23, wherein the total width is a sum of the two doped region widths (Pi+Pe) of the compensation doped region 41. Preferably, the two doped region widths of the compensation doped region are both not greater than 10% of the width W of the operation region 23; i.e., $Pi \leq W$ and $Pe \leq W$.

Please refer to FIG. 1B in conjugation with FIG. 2. Viewing from the cross-section view of FIG. 1B with reference to the top view of FIG. 2, the well region 22 has a depth D, which is defined as a distance extending from the upper surface 21a downward in the vertical direction. Please refer to FIG. 3 in conjugation with FIG. 2. Viewing from the cross-section view of FIG. 3 with reference to the top view of FIG. 2, the compensation doped region 41 has a depth H, which is defined as a distance extending from the upper surface 21a downward in the vertical direction. In the present invention, preferably, the depth H of the compensation doped region 41 is not deeper than the depth D of the well region 22 along the channel length direction. That is, $H \leq D$.

The present invention is different from the prior art in that: through the formation of a compensation doped region 41 which is substantially in contact with a recessed isolation region 23b along the channel length direction (referring to the cross-section view of FIG. 3 and the top view of FIG. 5), when a gate voltage below the designed threshold voltage is applied to the MOS device of the present invention, the part of the operation region 23a in contact with the recessed isolation region 23b will less likely form an inversion layer to turn on the MOS device 200, thus mitigating the threshold voltage roll-off of the MOS device 200.

Figure 6:
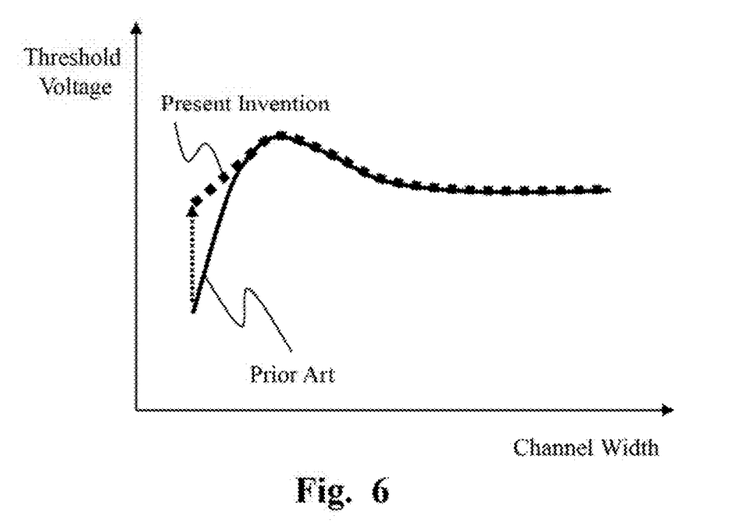
FIG. 6 shows characteristic curves of threshold voltage versus channel width of the MOS devices according to the prior art and the present invention, illustrating that the threshold voltage roll-off is significantly mitigated in the MOS device according to the present invention.

Please refer to FIG. 6. FIG. 6 shows characteristic curves of threshold voltage versus channel width of the MOS devices according to the prior art and the present invention, illustrating that the threshold voltage roll-off problem is significantly mitigated in the MOS device according to the present invention. A curve with solid line is the characteristic curve of threshold voltage versus channel width of the MOS device according to the prior art, whereas a curve with square dots is the characteristic curve of threshold voltage versus channel width of the MOS device according to the present invention. The characteristic curve of the prior art shows an obvious threshold voltage roll-off when the channel width is decreased beyond a certain limit. In contrast, the threshold voltage roll-off is significantly reduced in the MOS device 200 according to the present invention. Or from a different perspective, referring to FIG. 6, with the same threshold voltage, the MOS device 200 according to the present invention can operate with a relatively shorter channel width, as indicated by the dashed arrow in FIG. 6. This means that, with the same threshold voltage, the MOS device 200 according to the present invention has a relatively smaller size, and a relatively faster operation speed. These are advantages of the present invention over the prior art.

Figure 7:
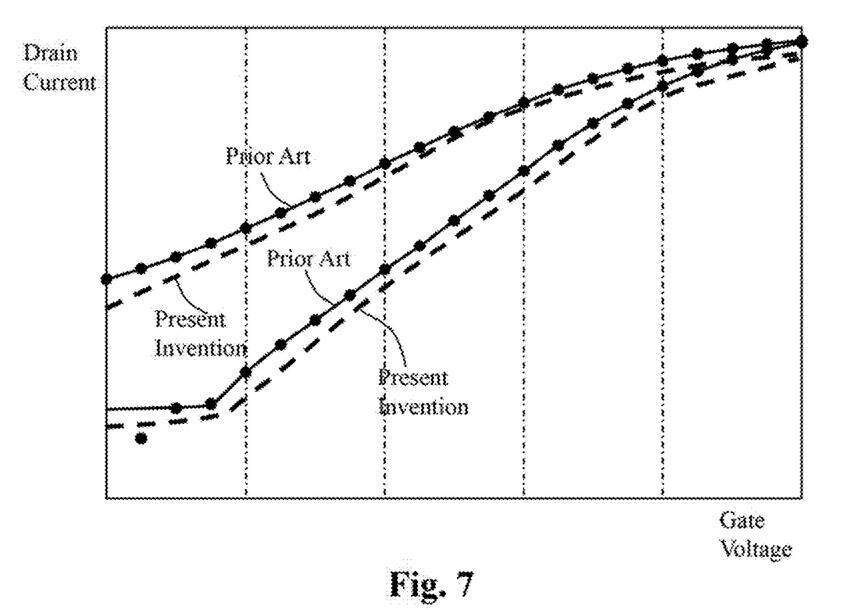
FIG. 7 shows a diagram of the sub-threshold conduction characteristic of the MOS device 200 of the present invention and that of the prior art when they operate in a sub-threshold region.

FIG. 7 shows a diagram of the sub-threshold conduction characteristic of the MOS device of the present invention and that of the prior art when they operate in a sub-threshold region. A solid curve with black circle nodes is the characteristic curve of drain current versus gate voltage according to the prior art, whereas, a dashed curve is the characteristic curve of drain current versus gate voltage according to the present invention. As shown in FIG. 7, when the MOS device 200 of the present invention and the prior art operate in a sub-threshold region, the MOS device 200 of the present invention, as compared to the prior art, has a relatively lower level of drain current. In other words, the undesirable current leakage is reduced And the threshold voltage roll-off problem is mitigated.

Note that: although the above-mentioned embodiments in FIGS. 1~5 are illustrated by taking an N-type MOS device as an example, the same technical features can also be applied to a P-type MOS device. That is, the conductive types of the P-type and the N-type layers, wells or regions, etc. can be interchanged, to form a device of an opposite conductive type.

The present invention has been described in considerable detail with reference to certain preferred embodiments thereof. It should be understood that the description is for illustrative purpose, not for limiting the scope of the present invention. An embodiment or a claim of the present invention does not need to achieve both the objectives or advantages of the present invention. The title and abstract are provided for assisting searches but not for limiting the scope of the present invention. Those skilled in this art ca readily conceive variations and modifications within the spirit of the present invention. For example, other manufacturing process steps or structures which do not affect the characteristics of the devices, such as a deep-well region, etc., can be added. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding a part of another embodiment. In view of the foregoing, the spirit of the present invention should cover both such and other modifications and variations, which should be interpreted to fall within the scope of the following claims and their equivalents.

What is claimed is:

1. A metal oxide semiconductor (MOS) device, comprising:
   a substrate having an upper surface, the substrate including an isolation region formed on the upper surface for defining an operation region; wherein, viewing from a first cross-section view taken along a channel width direction, the isolation region has a recessed portion located at a boundary between the isolation region and the operation region; and wherein, the operation region has a width in the channel width direction;
   a well region with a first conductive type, which is formed beneath the upper surface in the substrate;
   a gate, which is formed on the upper surface and which is stacked on and in contact with the upper surface in a vertical direction, wherein, viewing from a second cross-section view taken along a channel length direction which is perpendicular to the channel width direction, the gate is within the operation region, wherein, viewing from the first cross-section view, in the channel width direction, the gate extends beyond the recessed portion to reach a position above the isolation region;
   a source and a drain, each of which has a second conductive type, wherein, viewing from the second cross-section view, the source and the drain are at different sides of the gate, respectively;
   two lightly doped diffusions (LDDs) having a same conductive type as the source and the drain, wherein, viewing from the second cross-section view, the two LDDs are at different sides of the gate, respectively; and
   a compensation doped region with a first conductive type, which is formed beneath the upper surface in the substrate, wherein the compensation doped region is substantially in contact with at least a part of the recessed portion along the channel length direction;
   wherein, the compensation doped region has a total width in the channel width direction, the total width including a first doped region width in the channel width direction, which is defined as a distance inside the operation region as the total width is projected to the upper surface, and a second doped region width in the channel width direction, which is defined as a distance outside the operation region as the total width is projected to the upper surface, wherein the total width is a sum of the two doped region widths of the compensation doped region and the two doped region widths of the compensation doped region are both not greater than 10% of the width of the operation region;
   wherein, in the channel width direction, the first doped region width of the compensation doped region is a part of the width of the operation region;
   wherein, in the channel width direction, a part of the compensation doped region having the first doped region width is in contact with the drain;
   wherein, the compensation doped region has a depth, and the well region has a depth, and the depth of the compensation doped region is not deeper than the depth of the well region along the channel length direction, wherein depth is defined as a distance extending from the upper surface downward in a vertical direction which is perpendicular to both the channel width direction and the channel length direction.

2. The MOS device of claim 1, wherein a concentration of the first conductive type impurities of the compensation doped region is higher than a concentration of the first conductive type impurities of the well region.

3. The MOS device of claim 1, wherein the isolation region includes a shallow trench isolation (STI) structure.

4. The MOS device of claim 1, wherein, viewing from a top view, the compensation doped region entirely covers a junction between the operation region and the isolation region along the channel length direction.

5. A threshold voltage roll-off mitigation method for a MOS device, comprising:
   providing a substrate having an upper surface, the substrate including an isolation region formed on the upper surface for defining an operation region; wherein, viewing from a first cross-section view taken along a channel width direction, the isolation region has a recessed portion located at a boundary between the isolation region and the operation region; and wherein, the operation region has a width in the channel width direction;

forming a well region with a first conductive type, beneath the upper surface in the substrate;

forming a gate on the upper surface, which is stacked on and in contact with the upper surface in a vertical direction, wherein, viewing from a second cross-section view taken along a channel length direction which is perpendicular to the channel width direction, the gate is within the operation region, wherein, viewing from the first cross-section view, in the channel width direction, the gate extends beyond the recessed portion to reach a position above the isolation region;

forming a source and a drain, each of which has a second conductive type, wherein, viewing from the second cross-section view, the source and the drain are at different sides of the gate, respectively;

forming two lightly doped diffusions (LDDs) having a same conductive type as the source and the drain, wherein, viewing from the second cross-section view, the two LDDs are at different sides of the gate, respectively; and forming a compensation doped region with a first conductive type, beneath the upper surface in the substrate, wherein the compensation doped region is substantially in contact with at least a part of the recessed portion along the channel length direction;

wherein, the compensation doped region has a total width in the channel width direction, the total width including a first doped region width in the channel width direction, which is defined as a distance inside the operation region as the total width is projected to the upper surface, and a second doped region width in the channel width direction, which is defined as a distance outside the operation region as the total width is projected to the upper surface, wherein the total width is a sum of the two doped region widths of the compensation doped region and the two doped region widths of the compensation doped region are both not greater than 10% of the width of the operation region;

wherein, in the channel width direction, the first doped region width of the compensation doped region is a part of the width of the operation region;

wherein, in the channel width direction, a part of the compensation doped region having the first doped region width is in contact with the drain;

wherein, the compensation doped region has a depth, and the well region has a depth, and the depth of the compensation doped region is not deeper than the depth of the well region along the channel length direction, wherein depth is defined as a distance extending from the upper surface downward in a vertical direction which is perpendicular to both the channel width direction and the channel length direction.

6. The threshold voltage roll-off mitigation method for the MOS device of claim 5, wherein a concentration of the first conductive type impurities of the compensation doped region is higher than a concentration of the first conductive type impurities of the well region.

7. The threshold voltage roll-off mitigation method for the MOS device of claim 5, wherein the isolation region includes a shallow trench isolation (STI) structure.

8. The threshold voltage roll-off mitigation method for the MOS device of claim 5, wherein, viewing from a top view, the compensation doped region entirely covers a junction between the operation region and the isolation region along the channel length direction.

* * * * *